(12) United States Patent
Tsai

(10) Patent No.: US 12,218,061 B2
(45) Date of Patent: Feb. 4, 2025

(54) DRIVING CONNECTION STRUCTURES OF MEMORY DEVICES

(71) Applicant: Macronix International Co., Ltd., Hsinchu (TW)

(72) Inventor: Ya-Chun Tsai, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 411 days.

(21) Appl. No.: 17/574,170

(22) Filed: Jan. 12, 2022

(65) Prior Publication Data

US 2023/0223343 A1    Jul. 13, 2023

(51) Int. Cl.
| | | |
|---|---|---|
| H01L 23/535 | (2006.01) | |
| H01L 23/528 | (2006.01) | |
| H10B 41/27 | (2023.01) | |
| H10B 43/27 | (2023.01) | |

(52) U.S. Cl.
CPC ........ H01L 23/535 (2013.01); H01L 23/5283 (2013.01); H10B 41/27 (2023.02); H10B 43/27 (2023.02)

(58) Field of Classification Search
None
See application file for complete search history.

(56) References Cited

U.S. PATENT DOCUMENTS

| | | | | |
|---|---|---|---|---|
| 11,018,145 | B2* | 5/2021 | Lee | H10B 41/35 |
| 2019/0378855 | A1 | 12/2019 | Kim et al. | |
| 2020/0411542 | A1* | 12/2020 | Yang | H10B 41/10 |
| 2021/0082948 | A1* | 3/2021 | Kubota | H10B 43/27 |
| 2021/0242236 | A1* | 8/2021 | Shin | H10B 43/10 |
| 2021/0367051 | A1 | 11/2021 | Sun et al. | |
| 2021/0375918 | A1 | 12/2021 | Zhang | |
| 2022/0020681 | A1* | 1/2022 | Nojima | H10B 43/50 |
| 2022/0028440 | A1 | 1/2022 | Tang | |
| 2022/0102375 | A1* | 3/2022 | Kubo | H10B 41/35 |

FOREIGN PATENT DOCUMENTS

| | | |
|---|---|---|
| CN | 112106193 A | 12/2020 |
| TW | 202145520 A | 12/2021 |

* cited by examiner

*Primary Examiner* — Steven M Christopher
*Assistant Examiner* — Tyler J Wiegand
(74) *Attorney, Agent, or Firm* — Fish & Richardson P.C.

(57) ABSTRACT

Methods, systems and apparatus for managing driving connection structures of memory devices, e.g., three-dimensional memory devices. In one aspect, a semiconductor device includes: a first array structure of memory cells including first conductive layers, a second array structure of memory cells including second conductive layers, a connection structure arranged between the first and second array structures along a first direction, and a circuit arranged adjacent to the connection structure. The connection structure includes: first and second connection areas through which the first and second conductive layers are electrically connectable to the circuit, a first stepped structure configured to individually expose the first conductive layers in the first array structure, a second stepped structure configured to individually expose the second conductive layers in the second array structure. The first and second stepped structures are arranged between the first and second connection areas along a second direction perpendicular to the first direction.

18 Claims, 10 Drawing Sheets

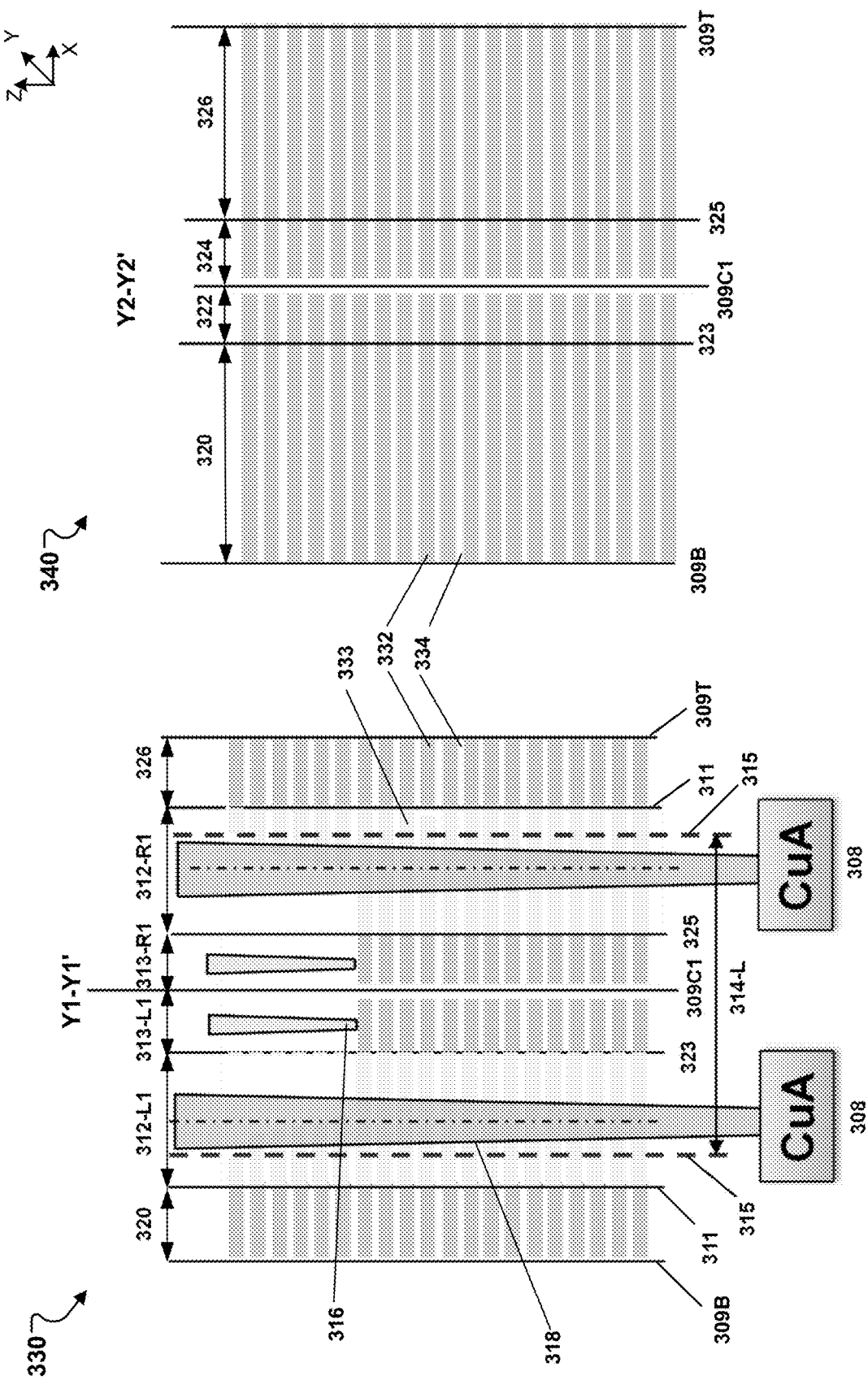

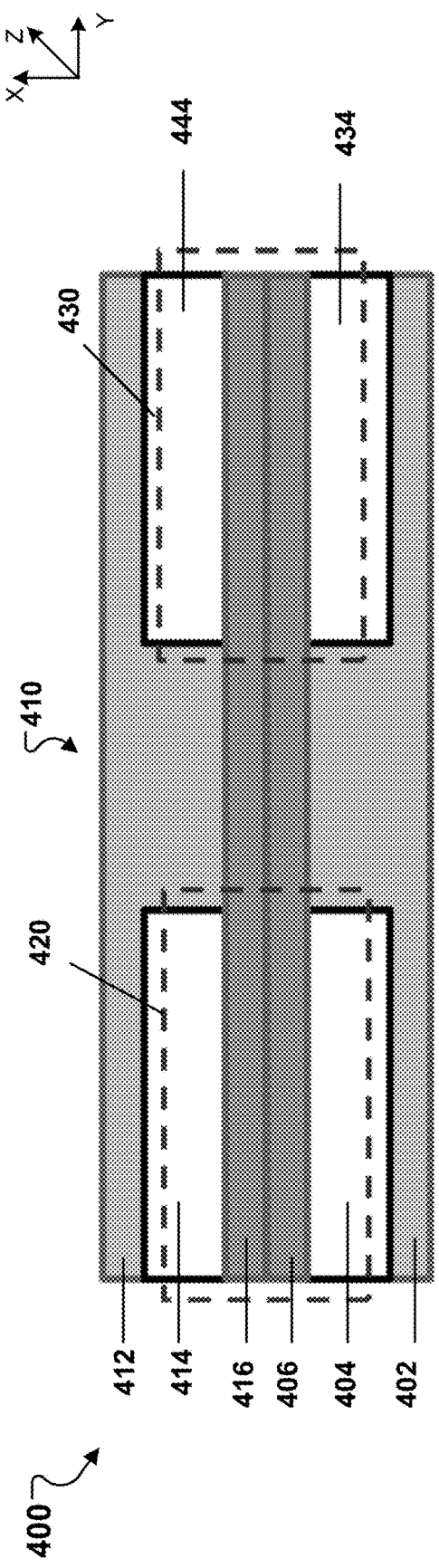
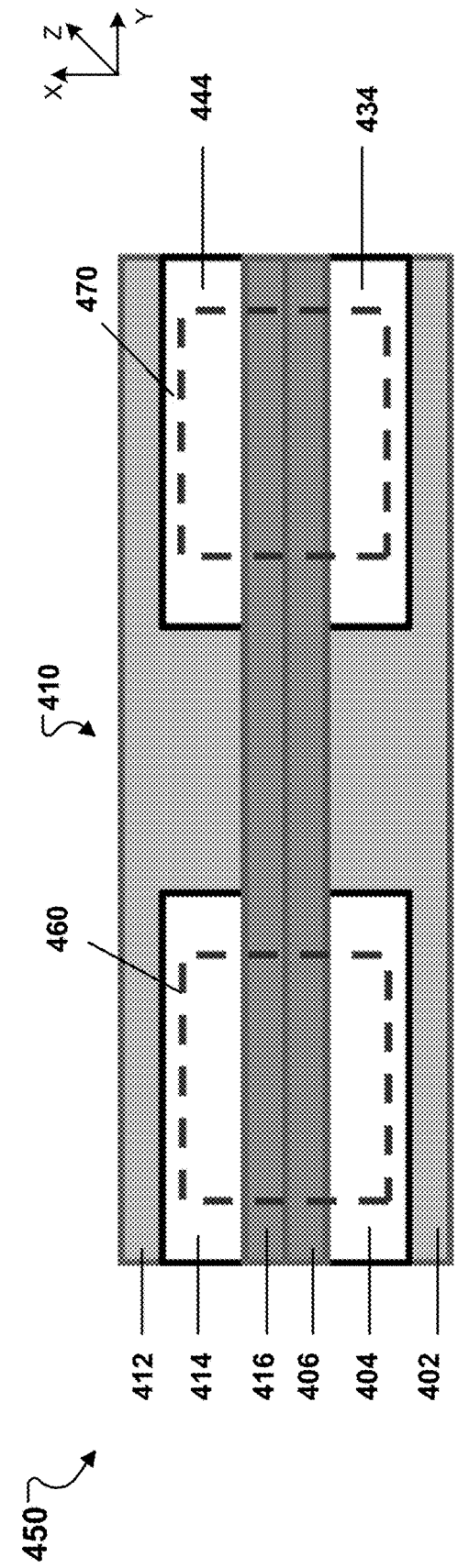
FIG. 4A
FIG. 4B

DRIVING CONNECTION STRUCTURES OF MEMORY DEVICES

BACKGROUND

Memory devices, e.g., high-density NAND flash memory devices, can have various structures to increase a density of memory cells and lines on a chip. For example, three-dimensional (3D) memory devices have been extensively explored to achieve increased memory cell densities with competitive cost. To fabricate a 3D memory device, advanced word lines patterning has been used, with repeated staircase etching and hard mask trimming processes, to produce staircase windows for word line contacts connected to driving circuits in the memory device.

SUMMARY

The present disclosure describes methods, systems, and techniques for managing driving connection structures of memory devices, e.g., 3D memory devices, which can increase staircase process windows for centralized word line contacts connected to driving circuits.

One aspect of the present disclosure features a semiconductor device including: a first array structure of memory cells including first conductive layers; a second array structure of memory cells including second conductive layers; a connection structure arranged between the first array structure and the second array structure along a first direction; and a circuit arranged adjacent to the connection structure. The connection structure includes: a first connection area through which the first conductive layers are electrically connectable to the circuit, a first stepped structure configured to individually expose the first conductive layers, a second stepped structure configured to individually expose the second conductive layers, and a second connection area through which the second conductive layers are connectable to the circuit. The first stepped structure and the second stepped structure are arranged between the first connection area and the second connection area along a second direction perpendicular to the first direction.

In some embodiments, the first stepped structure and the second stepped structure are adjacent to each other along the second direction. In some embodiments, the circuit includes an X-decoder.

In some embodiments, the first conductive layers are configured to be electrically connected to the circuit via first layer contacts coupled to the first conductive layers in the first stepped structure and first through array contacts through the first connection area and coupled to the circuit, and the second conductive layers are configured to be electrically connected to the circuit via second layer contacts coupled to the second conductive layers in the second stepped structure and second through array contacts through the second connection area and coupled to the circuit. The terms "electrically connected," "conductively connected," and "conductively coupled" are used interchangeably in the present disclosure.

In some embodiments, each of the first layer contacts and the second layer contacts is electrically connected to a respective one of the first through array contacts and the second through array contacts via a corresponding electrical interconnection. Each of the first connection area and the second connection area can be filled with at least one electrically insulated material.

In some embodiments, a process window covers, along the second direction, at least one part of the first connection area, the first stepped structure, the second stepped structure, and at least one part of the second connection area. Along the second direction, a length of the process window can be no less than 1.5 times larger than a sum of a length of the first stepped structure and a length of the second stepped structure. Along the first direction, a length of the process window can be smaller than at least one of a length of the first connection area or a length of the second connection area.

In some cases, a length of the process window can be larger than at least one of a length of the first connection area or a length of the second connection area along the first direction. In some cases, the length of the first connection area is identical to the length of the second connection area. In some cases, the first layer contacts and the second layer contacts are formed in the process window. In some cases, the first through array contacts and the second through array contacts are at least partially formed in the process window. In some cases, the first through array contacts and the second through array contacts are formed outside of the process window.

In some embodiments, the connection structure further includes: a third connection area spaced from the first connection area along the first direction and a fourth connection area spaced from the second connection area along the first direction. A first process window can cover, along the second direction, at least one part of the first connection area, the first stepped structure, the second stepped structure, and at least one part of the second connection area, and a second process window can cover, along the second direction, at least one part of the third connection area, the first stepped structure, the second stepped structure, and at least one part of the fourth connection area.

In some embodiments, the connection structure further includes: a first unprocessed structure electrically coupled to the first conductive layers in the first array structure, where at least one part of the first unprocessed structure is positioned, along the first direction, between the first connection area and the third connection area and outside of the first process window and the second process window, and a second unprocessed structure electrically coupled to the second conductive layers in the second array structure, where at least one part of the second unprocessed structure is positioned, along the first direction, between the second connection area and the fourth connection area and outside of the first process window and the second process window.

In some embodiments, another part of the first unprocessed structure is separated from the first stepped structure by the first connection area or the third connection area along the second direction, and another part of the second unprocessed structure is separated from the second stepped structure by the second connection area or the fourth connection area along the second direction.

In some embodiments, at least one of the first conductive layers in the first array structure is electrically connected to the circuit via a corresponding first unprocessed conductive layer in the first unprocessed structure, a corresponding first stepped conductive layer in the first stepped structure, a corresponding one of the first layer contacts, and a corresponding one of the first through array contacts.

In some embodiments, the corresponding first unprocessed conductive layer in the first unprocessed structure and the corresponding first stepped conductive layer in the first stepped structure form a single conductive layer.

In some embodiments, the corresponding first unprocessed conductive layer in the first unprocessed structure includes: a first sub-layer in a first part of the first unprocessed structure that is between the first connection area and the second connection area along the first direction and a second sub-layer in a second part of the first unprocessed structure that is separated from the first stepped structure by the first connection area and the third connection area along the second direction. The first sub-layer and the second sub-layer form the corresponding first unprocessed conductive layer.

In some embodiments, the corresponding first stepped conductive layer in the first stepped structure and the corresponding one of the first layer contacts are in one of the first process window or the second process window.

In some embodiments, at least one of the first conductive layers in the first array structure is electrically connected to the circuit via a corresponding first stepped conductive layer in the first stepped structure, a corresponding one of the first layer contacts, and a corresponding one of the first through array contacts, without through the first unprocessed structure.

In some embodiments, the first conductive layers are orderly arranged in the first array structure along a third direction perpendicular to a plane defined by the first direction and the second direction, and the second conductive layers are orderly arranged in the second array structure along the third direction, and an n-th first conductive layer in the first array structure and an n-th second conductive layer in the second array structure are electrically connected to a same conductive pad in the circuit, n being an integer.

Another aspect of the present disclosure features a semiconductor device including: a first array structure of memory cells including first conductive layers; a second array structure of memory cells including second conductive layers; a connection structure arranged between the first array structure and the second array structure along a first direction; and a circuit arranged adjacent to the connection structure. The connection structure includes: a first stepped structure configured to individually expose the first conductive layers, a first unprocessed structure electrically coupled to the first conductive layers in the first array structure, a first connection area through which the first conductive layers are electrically connectable to the circuit, the first connection area being arranged between the first stepped structure and the first unprocessed structure along a second direction perpendicular to the first direction, a second stepped structure configured to individually expose the second conductive layers, a second unprocessed structure electrically coupled to the second conductive layers in the second array structure, and a second connection area through which the second conductive layers are electrically connectable to the circuit, the second connection area being arranged between the second stepped structure and the second unprocessed structure along the second direction.

In some embodiments, the first stepped structure and the second stepped structure are adjacent to each other and arranged between the first connection area and the second connection area along the second direction.

In some embodiments, the first conductive layers are configured to be electrically connected to the circuit via first layer contacts coupled to the first conductive layers in the first stepped structure and first through array contacts through the first connection area and coupled to the circuit.

In some embodiments, at least one of the first conductive layers in the first array structure is electrically connected to the circuit via a corresponding first unprocessed conductive layer in the first unprocessed structure, a corresponding first stepped conductive layer in the first stepped structure, a corresponding one of the first layer contacts, and a corresponding one of the first through array contacts.

In some embodiments, the second conductive layers are configured to be electrically connected to the circuit via second layer contacts coupled to the second conductive layers in the second stepped structure and second through array contacts through the second connection area and coupled to the circuit.

In some embodiments, at least one of the second conductive layers in the second array structure is electrically connected to the circuit via a corresponding second unprocessed conductive layer in the second unprocessed structure, a corresponding second stepped conductive layer in the second stepped structure, a corresponding one of the second layer contacts, and a corresponding one of the second through array contacts.

In some embodiments, the connection structure further includes: a third connection area spaced from the first connection area along the first direction and a fourth connection area spaced from the second connection area along the first direction. In some embodiments, a first process window covers, along the second direction, at least one part of the first connection area, the first stepped structure, the second stepped structure, and at least one part of the second connection area, and a second process window covers, along the second direction, at least one part of the third connection area, the first stepped structure, the second stepped structure, and at least one part of the fourth connection area.

In some embodiments, the first unprocessed structure includes: a first part between the first connection area and the third connection area along the first direction and outside of the first process window and the second process window, and a second part separated from the first stepped structure by the first connection area and the third connection area along the second direction.

In some embodiments, the second unprocessed structure includes: a third part between the second connection area and the fourth connection area along the first direction and outside of the first process window and the second process window, and a fourth part separated from the second stepped structure by the second connection area and the fourth connection area along the second direction.

A further aspect of the present disclosure features a method of forming a semiconductor device, the method including: forming an array of memory cells including conductive layers; separating, along a first direction, the array of memory cells into a first array structure including first conductive layers, a second array structure including second conductive layers, and a connection structure between the first array structure and the second array structure; forming first through array contacts through a first connection area to be electrically connected to a circuit adjacent to the connection structure, and forming second through array contacts through a second connection area to be electrically connected to the circuit, where the first connection area and the second connection area are separated along a second direction perpendicular to the first direction; and forming a first stepped structure and a second stepped structure in a process window, where the first stepped structure and the second stepped structure are adjacent to each other along the second direction, where the process window covers at least one part of the first connection area, the first stepped structure, the second stepped structure, and at least part of the second connection area, and where the first stepped structure and the second stepped structure are between the first connection area and the second connection area along the second direction.

In some embodiments, the method further includes: forming first layer contacts coupled to the first conductive layers in the first stepped structure along a third direction perpendicular to a plane defined by the first direction and the second direction, and forming second layer contacts coupled to the second conductive layers in the second stepped structure along the third direction; and forming corresponding electrical interconnections to connect the first layer contacts and the second layer contacts to the first through array contacts and the second through array contacts.

The techniques implemented in the present disclosure can improve word line resistance-capacitance (RC) characteristics by centralizing word line contacts for driving hook-up to a circuit, e.g., X-decoder. The techniques can enlarge staircase process windows for the centralized word line (WL) contacts by adjusting (or rearranging) a location of unprocessed structures and/or connection areas, e.g., by moving the connection areas between the unprocessed structures and the staircase structures. The boundary of staircase process windows can be within the connection areas to increase the process windows of WL contacts and minimal incremental layer cost (MiLC) processes. The enlarged process windows can avoid small taper profiles that may impact word line contact landing areas. The techniques can pick out a same section (e.g., along Z direction) from adjacent memory array structures and keep the feasibility of simple word line driving routing due to the centralized WL contacts, without additional mask requests. The techniques can also achieve a good pattern uniformity and lower aspect ratio of deep etch processes.

The techniques implemented in the present disclosure can be applied to various memory types, such as SLC (single-level cell) devices, MLC (multi-level cell) devices like 2-level cell devices, TLC (triple-level cell) devices, or QLC (quad-level cell) devices. The techniques can be applied to various dimensions of memory devices or systems, such as three-dimensional (3D) memory devices or systems.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIGS. 3A-3G illustrate an example 3D memory device with a central staircase region positioned between memory cell array structures and having enlarged process windows.

FIGS. 4A-4B illustrate other examples of process windows for central staircase regions in 3D memory devices.

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1A:
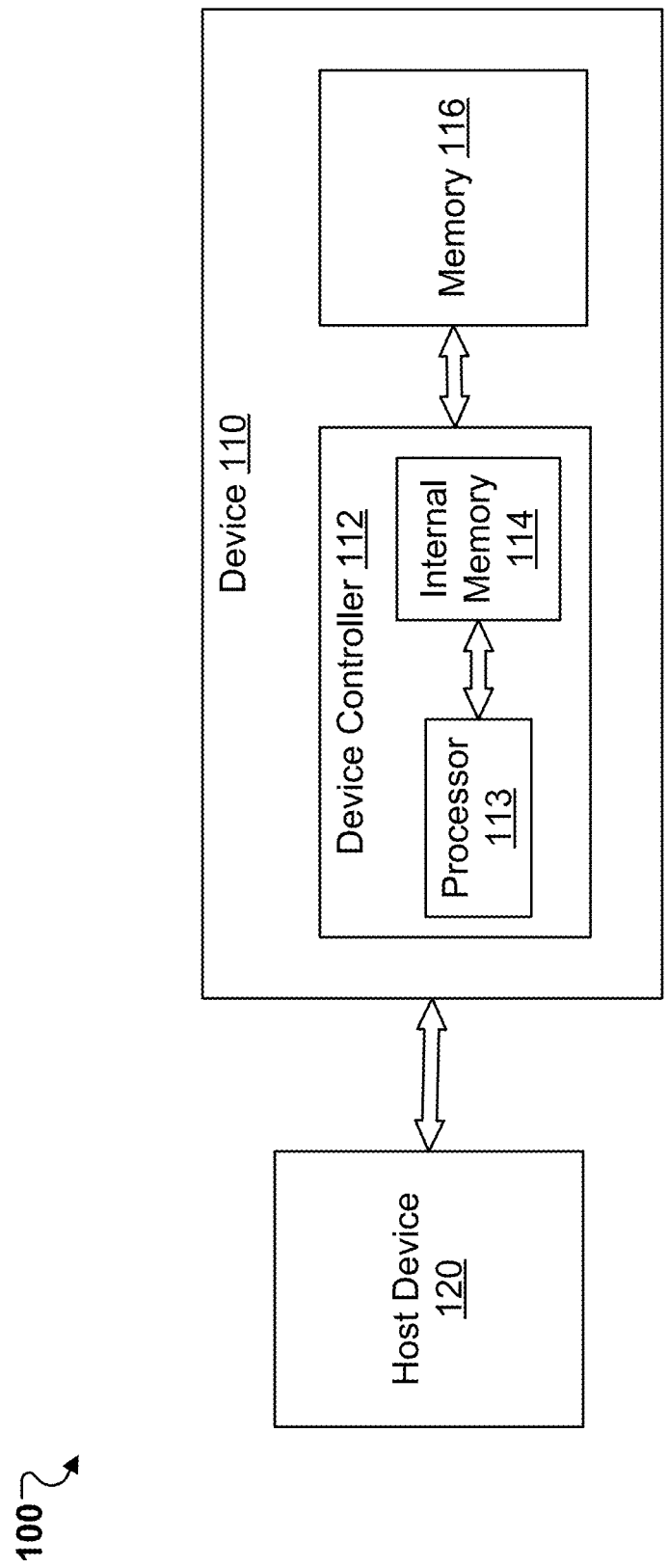
FIG. 1A illustrates an example of a system including a memory device.

FIG. 1A illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

The memory 116 includes a plurality of blocks. The memory 116 can be a two-dimensional (2D) memory including 2D memory blocks. The memory 116 can also be a three-dimensional (3D) memory including 3D memory blocks.

Figure 1B:
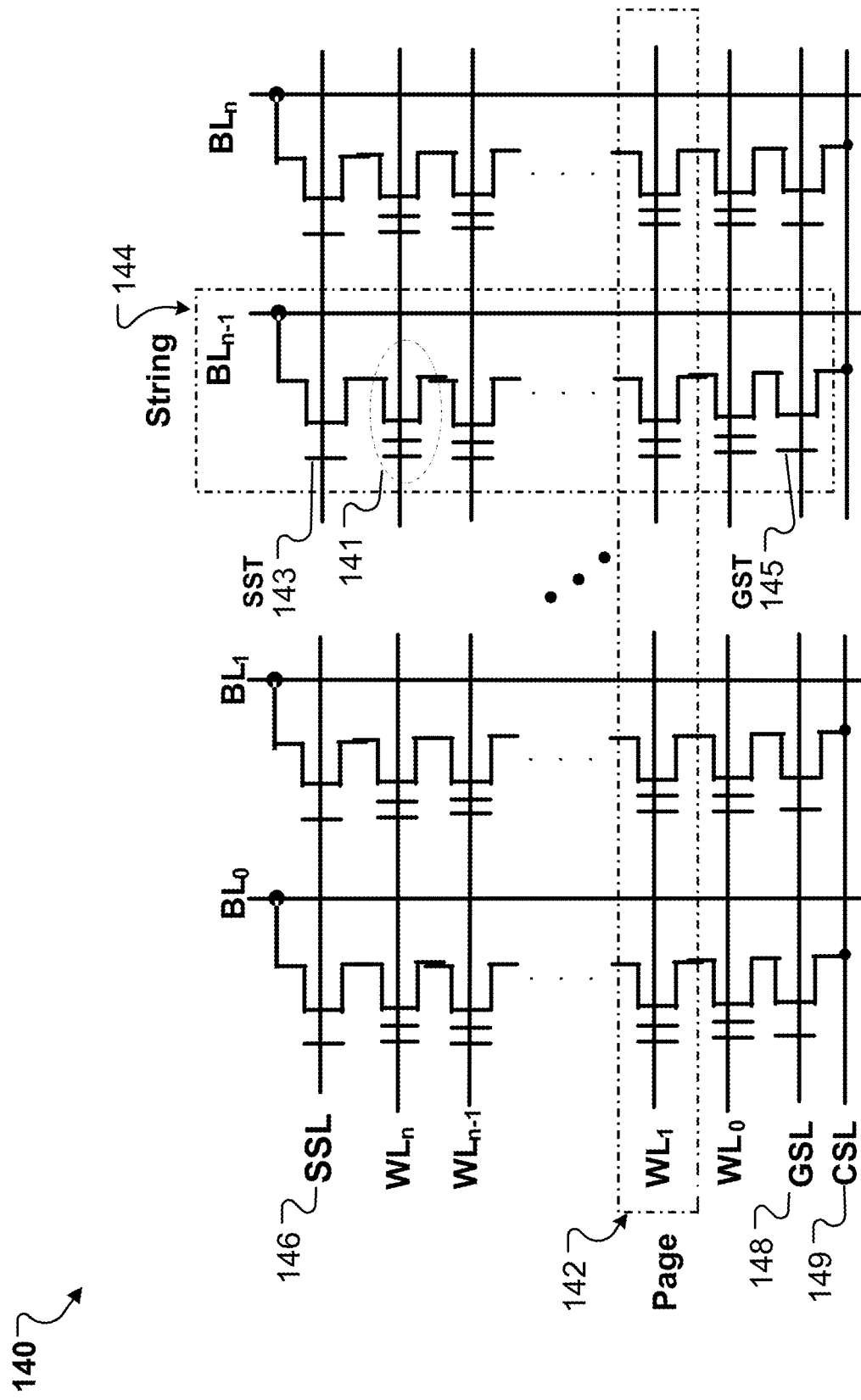
FIG. 1B illustrates an example block of a two-dimensional (2D) memory.

FIG. 1B illustrates an example configuration of a 2D memory block 140 when the memory 116 is a 2D memory. The block 140 includes memory cells 141 coupled in series to column bit lines $BL_0$, $BL_1$, ..., $BL_{n-1}$, and $BL_n$ to form a number of cell strings 144, and to row word lines $WL_0$, $WL_1$, ..., $WL_{n-1}$, and $WL_n$ to form a number of cell pages 142.

Each memory cell in a block includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs 143 in different strings are also connected to the same SSL. Gates of the memory cells 141 are respectively connected to word lines $WL_0$, $WL_1$, ..., $WL_{n-1}$, $WL_n$. The cell strings 144 or the memory cells 141 are connected to a common source line (CSL) 149 via the GST 145. The CSL 149 can be coupled to a ground. A gate of the GST 145 is connected to a ground select line (GSL) 148. Gates of the GSTs 145 in different strings 144 are also connected to the same GSL 148.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower voltage is applied onto a word line corresponding to the particular cell page 142. Meanwhile, a higher voltage is applied onto the other cell pages in the block 140.

Figure 1C:
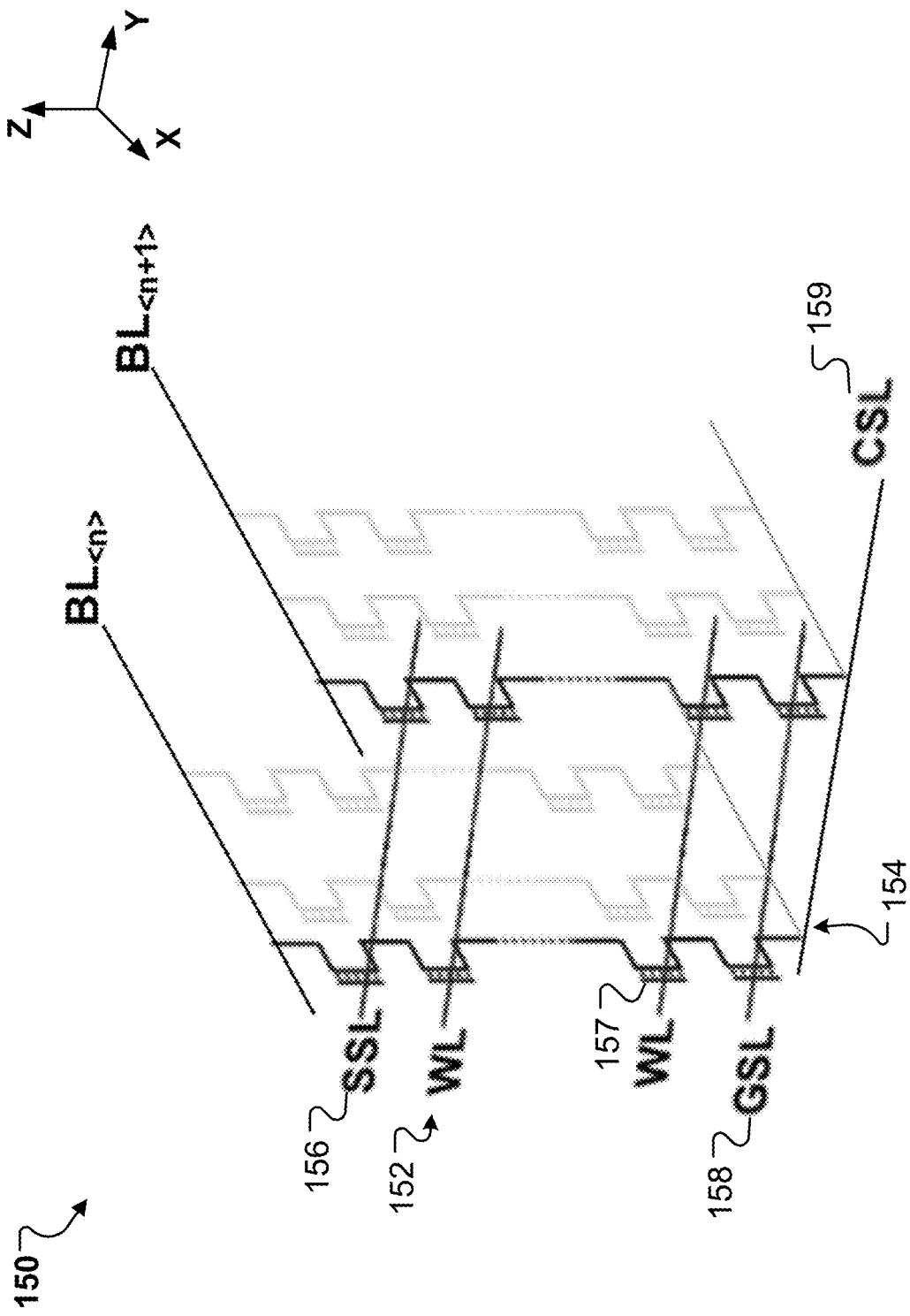
FIG. 1C illustrates an example block of a three-dimensional (3D) memory.

FIG. 1C illustrates an example 3D memory block 150 when the memory 116 (shown in FIG. 1A) is a 3D memory. The 3D memory block 150 can be a stack of the 2D memory block 140 of FIG. 1B. Memory cells 157 are arranged in three dimensions, e.g., in an XYZ coordinate system, and coupled to a number of word lines to form a number of cell pages (conductive layers or word line layers) 152 and a number of bit lines to form a number of cell strings 154. A cell page 152 can be a layer, e.g., in the XY plane, and memory cells 157 on the same layer can be coupled to one word line and have a same voltage. Each cell page 152 can be connected to a respective contact pad in a driving circuit, e.g., X-decoder (or a scanning driver).

A cell string 154 includes a number of memory cells 157 connected in series vertically along the Z direction, where a memory cell can be configured as an SST coupled to a string select line (SSL) 156 and a memory cell can be configured as a GST coupled to a ground select line (GSL) 158. The cell strings 154 are connected to one or more drivers, e.g., data drivers. The cell strings 154 of the memory cells 157 are connected to a common source line (CSL) 159 via the ground select transistors (GSTs). The SSL 156 can be a conductive line or layer formed on top of cell pages (or word line layers) 152. The memory block 150 can include multiple SSLs 156 on top of the cell pages 152. The CSL 159 can be a conductive layer (or multiple conductive lines) formed on a substrate of the 3D memory. The CSL 159 can be coupled to the ground.

Figure 2:
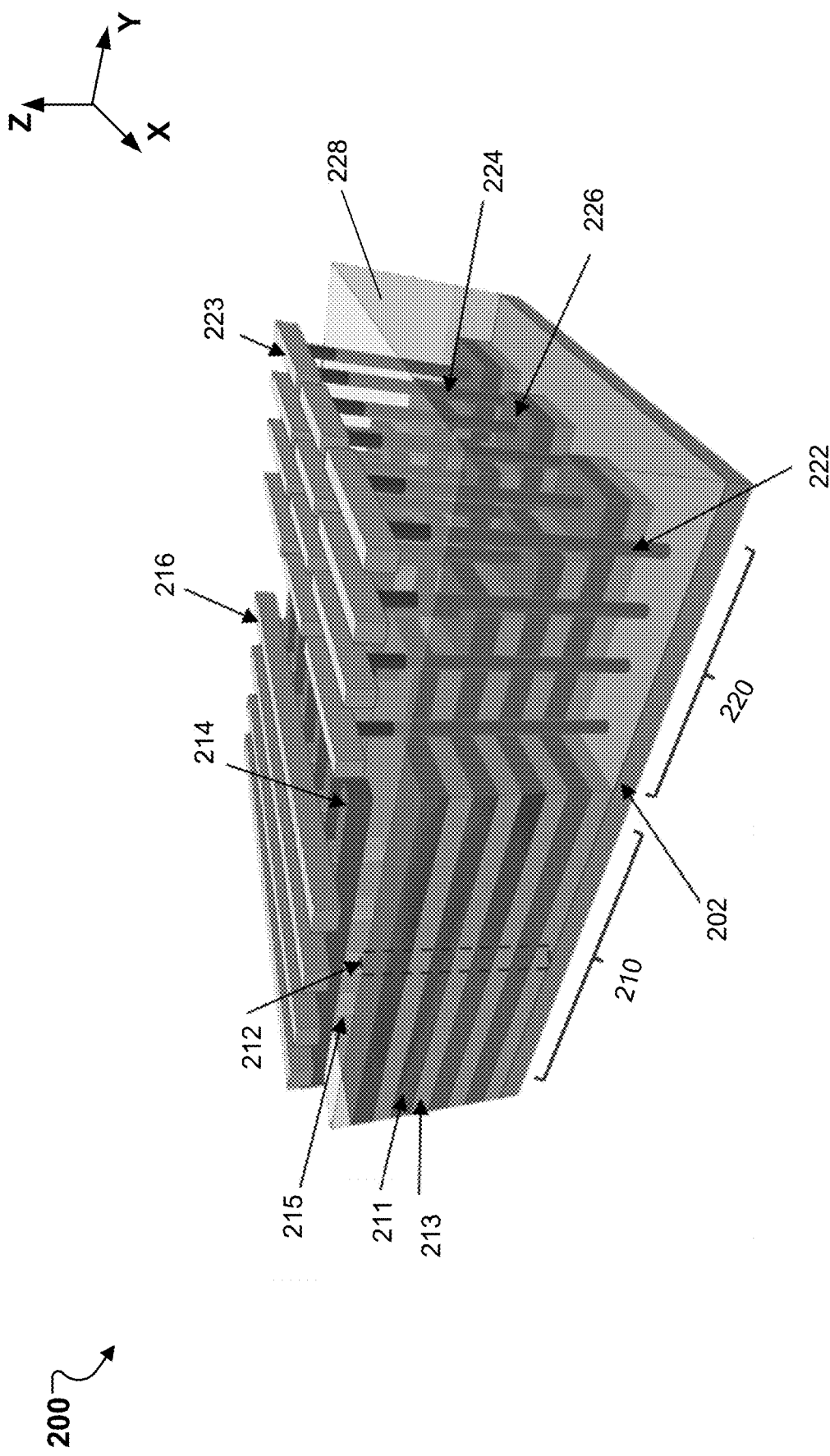
FIG. 2 illustrate an example 3D memory device with a staircase region for driving connections.

FIG. 2 illustrates a perspective view of an example 3D memory device 200. The 3D memory device 200 can be implemented as the memory 116 of FIG. 1A. The 3D memory device 200 includes a memory array region 210 and a staircase region 220 configured to conductively connect the memory array region to a driving circuit, e.g., a circuit under array (CuA) layer 202. The CuA layer 202 can be formed on or in a substrate. The substrate can include one or any combination of silicon, doped silicon, germanium, silicon germanium, semiconductor compounds, or other semiconductor materials.

The memory array region 210 includes a number of vertical channels (VCs) (or channel pillars) 212. Each VC 212 includes a string of memory cells, e.g., the cell string 144 of FIG. 1B or 154 of FIG. 1C, and is coupled to a corresponding bit line (BL) 216 through a corresponding conductive VIA 215. The VCs 212 are conductively coupled to the CuA layer 202. In some implementations, the CuA layer 202 includes a plurality of active devices, such as transistors and a number of conducive lines that are electrically coupled to the conductive layers 211 (gate layer or word line layer) and insulated by an insulating material.

The VCs 212 penetrates downwards through multiple alternating pairs of conductive layers 211 (gate layer or word line layer) and insulating layers 213. The insulating layers 213 can be made of a dielectric material, e.g., silicon oxide (simplified as oxide or OX). The conductive layers 211 can be made of a conductive material, e.g., a metal such as Tungsten (W). The conductive layers can form one more SSLs 214, e.g., SSL 156 of FIG. 1C, one or more word lines (WLs) 211, e.g., WL 157 of FIG. 1C, and one or more GSLs, e.g., GSL 158 of FIG. 1C. An external surface of the VC 212 contact the conductive layers 211, which act as gates of the memory cells. The VC 212s can include multiple layers that can include a tunneling layer, a charge trapping layer, and a blocking layer. The tunneling layer can include a silicon oxide, or a silicon oxide/silicon nitride combination (e.g. Oxide/Nitride/Oxide or ONO). The charge trapping layer can include silicon nitride (SiN) or other materials capable of trapping charges. The blocking layer can include silicon oxide, aluminum oxide, and/or combinations of such materials. The multiple layers can be formed on an internal surface of the VC 212, and polysilicon can be filled in a middle of the VC 212. The filled materials (e.g., the multiple layers and polysilicon) in each VC 212 intersecting the conductive layers 211 can form a string of memory cells along the vertical direction such as Z direction. A bit line pad (BLP) can be formed on a top of the VC 212 to seal the VC 212 such that the interior of the VC 212 is separated from an external environment during processing. The BLP is conductive and can be coupled to a bit line 216 through the conductive VIA 215.

The staircase region 220 is configured to conductively connect word line layers 211 to the CuA layer 202. As illustrated in FIG. 2, a staircase structure is formed as an extension of the memory array region 210, such that each word line layer 211 can be individually connected to a corresponding word line layer contact (WL_COA) 224 at a landing area 226. The corresponding word line layer contact 224 is conductively connected to a respective contact pad in the CuA layer 202 through a corresponding through array contact (TAC) 222 that penetrates through an insulating material 228 filled in the staircase region 220. The corresponding word line layer contact 224 is conductively connected to the corresponding TAC 222 through a conductive interconnection 223.

As illustrated in FIG. 2, the memory array region 210 is adjacent to the staircase region 220. When the number of memory cells in each word line layer (e.g., along Y direction) is large, e.g., more than thousands of memory cells, word line resistance-capacitance (RC) characteristics of the word line layer may be affected. For example, memory cells farther from the staircase region 220 may have a slower response speed than memory cells closer to the staircase region 220. In some implementations, as discussed with further details in FIGS. 3A-3G, a memory array region can be divided into two or more memory array structures, and a central staircase region can be arranged between two adjacent memory array structures and configured to provide conductive connections for word line layers in the two adjacent memory array structures to the CuA layer 202. To simplify driving signal routing, it is highly desirable to pick out the same section (e.g., along Z direction) from the two adjacent memory array structures.

Additionally, when the number of word line layers is large (e.g., along Z direction), e.g., more than one hundred, etched depths for word line layer contacts (e.g., WL_COAs 224) in a staircase region become deeper and deeper, and taper profiles of the word line layer contacts can be observed if a staircase process window for the word line layer contacts is small. A small taper profile can affect landing of the word line layer contacts, which may affect the performance of the conductive connections and thus the performance of the memory device.

Implementations of the present disclosure provide methods and techniques for enlarging staircase process windows to avoid small taper profiles of word line layer contacts for conductive connections to a driving circuit (e.g., X-decoder). In some implementations, the staircase process windows for the word line layer contacts are enlarged by adjusting (or rearranging) a location of unprocessed structures and/or connection areas, e.g., by moving the connection areas between the unprocessed structures and the staircase structures. The boundary of staircase process windows can be within the connection areas to increase the process windows of WL layer contacts.

FIGS. 3A-3G illustrate an example memory block 300 of a 3D memory device. The 3D memory device can be implemented as the memory 116 of FIG. 1A, and the memory block 300 can be implemented as the memory block 150 of FIG. 1C. The memory block 300 includes a central staircase region 310 positioned between two adjacent array structures of memory cells, e.g., left array structure 302 on the left of the central staircase region 310 and right array structure 304 on the right of the central staircase region 310. The central staircase region 310 has enlarged staircase process windows for implementing word line layer contacts to conductively connect word line layers in the array structures 302 and 304 to a circuit such as X-decoder (e.g., the CuA layer 202 of FIG. 2) under the central staircase region 310.

Figure 3A:
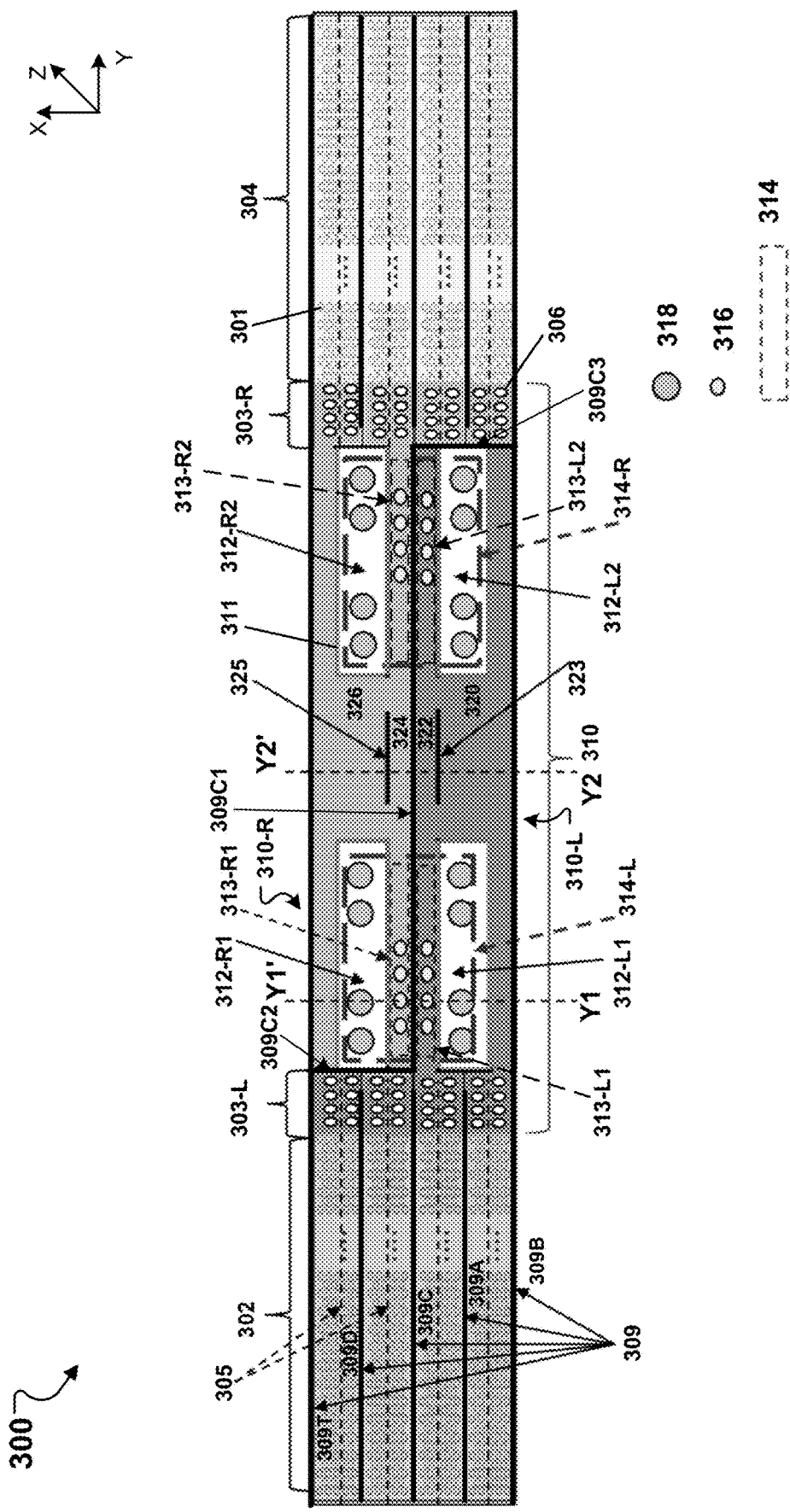

FIG. 3A shows a top view (in the XY plane) of the memory block 300. FIGS. 3B and 3C show cross-sectional views Y1-Y1' 330 and Y2-Y2' 340 (in the XZ plane), respectively. The left array structure 302, the central staircase region 310, and the right array structure 304 are sequentially arranged along a first direction, e.g., Y direction. Each of the array structures 302 and 304 includes a number of memory cells 301, e.g., formed by fabricating vertical channels (such as VCs 212 of FIG. 2) through a plurality of pairs of alternating conductive layers (e.g., the conductive layer 211 of FIG. 2) and insulating layers (e.g., the insulating layers 213 of FIG. 2). The array structures 302 and 304 are independently controlled to perform operations (e.g., read, write, and erase) and can be considered as separated blocks.

The memory block 300 can be separated into different units by conductive slits 309, including a top conductive slit 309T, a bottom conductive slit 309B, a center conductive slit 309C, and two middle conductive slits 309A and 309D. The conductive slits 309 extend in the YZ plane through the 3D memory array to a common source line (CSL) layer (e.g., the CSL 159 of FIG. 1C) under the 3D memory array. Each conductive slit 309 has a side surface (or wall) covered with a dielectric material (e.g., oxide) insulated from adjacent layers and an inner part filled with a conductive material (e.g., metal). The common source line layer can be made of any one of polysilicon, epitaxial (Epi), or metal. A conductive slit 309 can act as a source line, and adjacent source lines can be conductively coupled together through the CSL layer. Each unit is between two adjacent conductive slits 309. As illustrated in FIG. 3A, each of the array structures 302 and 304 is separated into four units by three conductive slits 309, e.g., 309A, 309C, 309D.

The memory block 300 can also include one or more string select line (SSL) cuts 305 that divide the block 300 (or the units) into different parts (e.g., sub-blocks). As illustrated in FIG. 3A, each unit is divided into two parts, and each of the array structures 302 and 304 is divided into eight parts (or sub-blocks) by the conductive slits 309 and the SSL cuts 305. Each SSL cut 305 is filled with a dielectric material (e.g., oxide) and extend along the Y direction. The SSL cut 305 also extends along Z direction into multiple conductive layers on top of word line layers of the 3D memory block 300 so that the multiple conductive layers function as SSL layers (e.g., the SSLs 214 of FIG. 2). Each part (e.g., sub-block) can be independently controlled, e.g., through a corresponding SSL layer.

As illustrated in FIG. 3A, the central staircase region 310 has a first part 310-L and a second part 310-R arranged along a second direction (e.g., X direction) perpendicular to the first direction (e.g., Y direction). The first part 310-L is connected to the left array structure 302 and configured to conductively connect word line layers in the left array structure 302 to the circuit. The second part 310-R is connected to the right array structure 304 and configured to conductively connect word line layers in the right array structure 304 to the circuit. The first part 310-L and the second part 310-R can be separated by a conductive slit 309C1, that can extend along a third direction (e.g., Z direction) perpendicular to a plane (e.g., XY plane) defined by the first direction (e.g., Y direction) and the second direction (e.g., X direction). As shown in FIG. 3A, the conductive slit 309C1 can be separated from the conductive slit 309C in the left array structure 302 and/or in the right array structure 304.

In some implementations, along the Y direction, as illustrated in FIG. 3A, the central staircase region 310 includes conductive contact regions 303-L and 303-R respectively for the array structures 302 and 304. In the conductive contact regions 303-L and 303-R, conductive contacts 306 are conductively connected to corresponding selected SSL layers (or transistor layers). As further illustrated in FIG. 3G, a topography along Y direction includes a flat protrusion 382 and recess regions 381. The recess region 381 includes alternating conductive layers 332 (e.g., metal such as W) and insulating layers 334 (e.g., oxide). A slope of the recess region 381 is a staircase structure. The conductive contact regions 303-L and 303-R include staircase structures like the slope of the recess region 381. Each of the staircase structures individually exposes conductive layers (e.g., SSL layers or transistor layers) in the conductive contact regions 303-L and 303-R. The topography can be also a kind of staircase.

As illustrated in FIG. 3A, the first part 310-L, the conductive contact region 303-L, and the left array structure 302 are electrically insulated from the second part 310-R, the conductive contact region 303-R, and the right array structure 304 by conductive slits 309T, 309C2, 309C1, 309C3, and 309B that can be connected together. Sidewall surfaces of the conductive slits 309C1, 309C2, 309C3 are covered by a dielectric material (e.g., oxide). The two array structures 302 and 304 can be independently controlled or operated. The conductive slit 309C and adjacent parallel conductive slits 309D, 309A do not connect to the conductive slits 309C2, 309C1 and 309C3. Thus, the conductive layers 332 (SSL planes or word line planes) of adjacent sub-blocks in the same block (e.g., 304) are integral in the following regions: 304, 303-R, 324, 326, as illustrated in FIG. 3A. Likewise, the conductive layers 332 (SSL plane or word line planes) of adjacent sub-blocks in the same block (e.g. 302) are integral in the following regions: 302, 303-L, 322, 320, as illustrated in FIG. 3A.

In some implementations, the first part 310-L includes a first connection area 312-L1 through which the word line layers in the left array structure 302 are electrically connectable to the circuit adjacent to (e.g., under) the first part 310-L. For example, a plurality of through array contacts (TACs) 318 can be formed within the first connection area 312-L1 to penetrate through the first connection area 312-L1. The TACs 318 can be similar to the TACs 222 of FIG. 2. Each TAC 318 can be conductively connected to a respective contact pad 308 in the CuA layer (as illustrated in FIG. 3B). In some examples, as illustrated in FIG. 3B, the first connection area 312-L1 is insulated from surrounding alternating conductive layers 332 (e.g., metal such as W) and insulating layers 334 (e.g., OX) by dielectric layers 311. The first connection area 312-L1 can include alternating pairs of first insulating layer 333 (e.g., SIN) and second insulating layer 334 (e.g., OX).

In some implementations, the central staircase region 310 is initially composed of alternating pairs of first insulating layer 333 (e.g., SIN) and second insulating layer 334. The first connection area 312-L1 can be formed by separating the first connection area 312-L1 from surrounding regions by the dielectric layers 311, and then the surrounding regions are etched to remove the first insulating layers 333 and deposit the conductive material (e.g., metal such as W) to form the conductive layers 332 during a gate replacement process. The dielectric layers 311 can be made of an electrically insulating material and be configured to prevent a removal of the first insulating layers 333 in the first connection area 312-L1 during the gate replacement process. That is, the gate replacement process is not performed in the first connection area 312-L1. In some implementations, the first connection area 312-L1 can be formed by etching away the alternating pairs of first insulating layer 333 and second insulating layer 334 and filled with an electrically insulating material (e.g., SIN or OX). Likewise, other connection areas 312-L2, 312-R1 and 312-R2 can be formed by similar processes.

The first connection area 312-L1 can be adjacent to the conductive contact regions 303-L that is adjacent to the left array structure 302. In some examples, as illustrated in FIG. 3A, the first part 310-L includes a third connection area 312-L2 that is similar to the first connection area 312-L1. The third connection area 312-L2 is adjacent to the conductive contact regions 303-R that is adjacent to the right array structure 304. The third connection area 312-L2 and the conductive contact region 303-R is separated by the conductive slit 309C3, which is along the second direction (e.g., X direction). The third connection area 312-L2 is separated from the first connection area 312-L1 along the Y direction. The first connection area 312-L1 and the third connection area 312-L2 can have the same size, height (along X direction), and/or width (along Y direction). The connection areas 312-L1 and 312-L2 can be away from the conductive slit 309C1 with a distance.

As illustrated in FIGS. 3A-3B, the first part 310-L includes a first word line landing pad area 313-L1 with a first stepped structure formed between the first connection area 312-L1 and the conductive slit 309C1. The first stepped structure in the first word line landing pad area 313-L1 is configured to individually expose conductive layers in the left array structure 302. A plurality of word line layer contacts (WL_COA) 316, e.g., the WL_COA 224 of FIG. 2, are formed in the first word line landing pad area 313-L1 connected to corresponding word line landing pads. The word line layer contacts (WL_COA) 316 can be conductively connected to the corresponding TACs 318 formed in the first connection area 312-L1 through corresponding conductive interconnections, e.g., the interconnections 223 of FIG. 2. Each TAC 318 can be conductively connected to a respective contact pad 308 in the CuA layer. In such a way, a word line layer in the left array structure 302 can be conductively connected to a respective contact pad 308 in the circuit through the corresponding WL_COA 316, the corresponding electrical interconnection, and the corresponding TAC 318. Likewise, the first part 310-L further includes a second word line landing pad area 313-L2 with another first stepped structure formed between the third connection area 312-L2 and the conductive slit 309C1. A word line layer in the left array structure 302 can be conductively connected to a respective contact pad 308 in the circuit under array through the corresponding WL_COA 316 (in the second word line landing pad area 313-L2), the corresponding electrical interconnection, and the corresponding TAC 318 (in the third connection area 312-L2).

Similarly, the second part 310-R includes a second connection area 312-R1 through which word line layers in the right array structure 304 electrically connecting to the circuit adjacent to (e.g., under) the second part 310-R. The second connection area 312-R1 can be similar to the first connection area 312-L1. The second connection area 312-R1 can be adjacent to the left array structure 302 and have the same length as the first connection area 312-L1 along the first direction (e.g., Y direction). As shown in FIGS. 3A-3B, the second connection area 312-R1 and the first connection area 312-L1 may be disposed at opposite sides of the conductive slit 309C1 (or the conductive slit 309C) along the second direction (e.g., X direction).

Similarly, a plurality of through array contacts (TACs) 318 are formed within the second connection area 312-R1. The TACs 318 can be similar to the TACs 222 of FIG. 2. Each TAC 318 is conductively connected to a respective contact pad 308 in the CuA layer (as illustrated in FIG. 3B). The second connection area 312-R1 is insulated from surrounding alternating conductive layers 332 and insulating layers 334 by the dielectric layers 311, as illustrated in FIG. 3B. In some implementations, similar to the first connection area 312-L1, the second connection area 312-R1 can be formed by etching away the alternating pairs of first insulating layer 333 and second insulating layer 334 and filled with an electrically insulating material (e.g., nitride or oxide). The first connection area 312-L1 and the second connection area 312-R1 can include alternating pairs of first insulating layer 333 and second insulating layer 334, or an electrically insulating material.

In some examples, as illustrated in FIG. 3A, the second part 310-R includes a fourth connection area 312-R2 that is similar to the second connection area 312-R1. The fourth connection area 312-R2 is adjacent to the conductive contact region 303-R that is adjacent to the right array structure 304. The fourth connection area 312-R2 is separated from the second connection area 312-R1 along the Y direction. The second connection area 312-R1 and the fourth connection area 312-R2 can have the same size, height (along X direction), and/or width (along Y direction). Along the X direction, the connection areas 312-R1 and 312-R2 can be spaced from the conductive slit 309C1 with a distance.

As illustrated in FIGS. 3A-3B, the second part 310-R includes a first word line landing pad area 313-R1 with a second stepped structure formed between the second connection area 312-R1 and the conductive slit 309C1. The second stepped structure in the first word line landing pad area 313-R1 is configured to individually expose conductive layers in the right array structure 304. A plurality of word line layer contacts (WL_COA) 316, e.g., the WL_COA 224 of FIG. 2, are formed in the in the first word line landing pad area 313-R1 connected to corresponding word line landing pads. The word line layer contacts (WL_COA) 316 can be conductively connected to the corresponding TACs 318 formed in the second connection areas 312-R1 through corresponding conductive interconnections, e.g., the interconnections 223 of FIG. 2. Each TAC 318 in the second connection area 312-R1 can be conductively connected to a respective contact pad 308 in the CuA layer (as shown in FIG. 3B). In such a way, each word line layer in the right array structure 304 can be conductively connected to a respective contact pad 308 in the circuit through the corresponding WL_COA 316 (in the first word line landing pad area 313-R1), the corresponding electrical interconnection, and the corresponding TAC 318 (in the second connection area 312-R1). Likewise, the second part 310-R further includes a second word line landing pad area 313-R2 with another second stepped structure formed between the fourth connection area 312-R2 and the conductive slit 309C1. A word line layer in the right array structure 304 can be conductively connected to a respective contact pad 308 in the circuit under array through the corresponding WL_COA 316 (in the second word line landing pad area 313-R2), the corresponding electrical interconnection, and the corresponding TAC 318 (in the fourth connection area 312-R2).

Along the second direction (e.g., X direction), the first word line landing pad area 313-L1 in the first part 310-L and the first word line landing pad area 313-R1 in the second part 310-R are arranged between the first and second connection areas 312-L1 and 312-R1. The first word line landing pad area 313-L1 and the first word line landing pad area 313-R1 can be adjacent to each other along the X direction and separated by the conductive slit 309C1. Similarly, along the second direction (e.g., X direction), the second word line landing pad area 313-L2 in the first part 310-L and the second word line landing pad area 313-R2 in the second part 310-R are arranged between the third and fourth connection areas 312-L2 and 312-R2. The second word line landing pad area 313-L2 and the second word line landing pad area 313-R2 can be adjacent to each other along the X direction and separated by the conductive slit 309C1.

In some implementations, as illustrated in FIGS. 3A-3B, a process window 314-L has a boundary 315 and covers both the first word line landing pad area 313-L1 in the first part 310-L and the first word line landing pad area 313-R1 in the second part 310-R. The process window 314-L can also cover at least one part of the first connection area 312-L1 in the first part 310-L, at least one part of the second connection area 312-R1 in the second part 310-R, or both. In some implementations, the process window 314-L can be formed by a minimal incremental layer cost (MiLC) process to reduce cost. The MiLC process can create a number of staircase structures with landing pads for each word line layer. The MiLC process can use minimum photoresist (or photolithography) and etching steps to create the staircase structures. The process window 314-L can be referred to as MiLC process window.

As illustrated in FIG. 3B, individual word line layers can be exposed in the process window 314-L and can be conductively connected to the respective contact pads in the circuit by forming WL_COA 316 in the staircase structures of the first word line landing pad area 313-L1 in the first part 310-L and the first word line landing pad area 313-R1 in the second part 310-R. In a particular example, the MiLC process may cause a deeper stepped word line layer to extend a little bit shorter than an adjacent shallower stepped word line layer.

Similarly, another process window 314-R can cover both the second word line landing pad area 313-L2 in the first part 310-L and the second word line landing pad area 313-R2 in the second part 310-R. The process window 314-R can also cover at least one part of the third connection area 312-L2 in the first part 310-L, at least one part of the fourth connection area 312-R2 in the second part 310-R, or both. The process windows 314-L, 314-R can be referred to generally as process windows 314 or individually as process window 314.

As illustrated in FIGS. 3A-3C, in the central staircase region 310, there are multiple unprocessed structures 320, 322, 324, 326 that are outside of the process windows 314 and have no stepped or staircase structured word line layers. Each of the unprocessed structures 320, 322, 324, 326 can be referred to as a stack of alternating conductive layers 332 and insulating layers 334 not performed by a method of staircase structures with landing pads formation for word line layers, for example, the MiLC process. The unprocessed structures include a first unprocessed structure 320, a second unprocessed structure 326, a third unprocessed structure 322, and a fourth unprocessed structure 324, among which the first and third unprocessed structures 320 and 322 are in the first part 310-L and the second and fourth unprocessed structures 326 and 324 are in the second part 310-R.

The first unprocessed structure 320 in the first part 310-L can include a first area and a second area. The first area of the first unprocessed structure 320 is between the first connection area 312-L1 and the third connection area 312-L2 along Y direction, and between a conductive slit 323 and the conductive slit (source line) 309B along X direction. The conductive slit 323 has a side surface (or wall) covered with a dielectric material (e.g., oxide) insulated from adjacent layers and an inner part filled with a conductive material (e.g., metal). The second area of the first unprocessed structure 320 includes a first section and a second section. The first section is between the first connection area 312-L1 and the adjacent conductive slit (source line) 309B. The second section is between the third connection area 312-L2 and the adjacent conductive slit (source line) 309B. The first unprocessed structure 320 is outside of the process windows 314 and has no stepped or staircase structured word line layers, as illustrated in FIGS. 3B-3C. Likewise, The third unprocessed structure 322 in the first part 310-L is between the first word line landing pad area 313-L1 and the second word line landing pad area 313-L2 along Y direction, and between the conductive slit 323 and the conductive slit 309C1 along X direction. The first connection area 312-L1 is between the first section of the second area of the first unprocessed structure 320 and the first word line landing pad areas 313-L1. The third connection area 312-L2 is between the second section of the second area of the first unprocessed structure 320 and the second word line landing pad area 313-L2 along X direction. The boundary 315 of the process window 314-L can be away from the first word line landing pad area 313-L1 to increase the process window 314-L. The first unprocessed structure 320 and the third unprocessed structure 322 are conductively connected to the left array structure 302 through the word line layer contacts WL_COA 316 in the first word line landing pad area 313-L1 and in the second word line landing pad area 313-L2.

In some implementations, as illustrated in FIG. 3A, the third unprocessed structure 322 is separated from the first unprocessed structure 320 by the conductive slit 323 along Y direction. The conductive slit 323 does not extend to connect the connection areas 312-L1 and 312-L2. Hence, the word line layers in the first unprocessed structure 320 can be conductively connected to word line layers in the third unprocessed structure 322 through an unseparated area without the conductive slit 323.

Figure 3D:
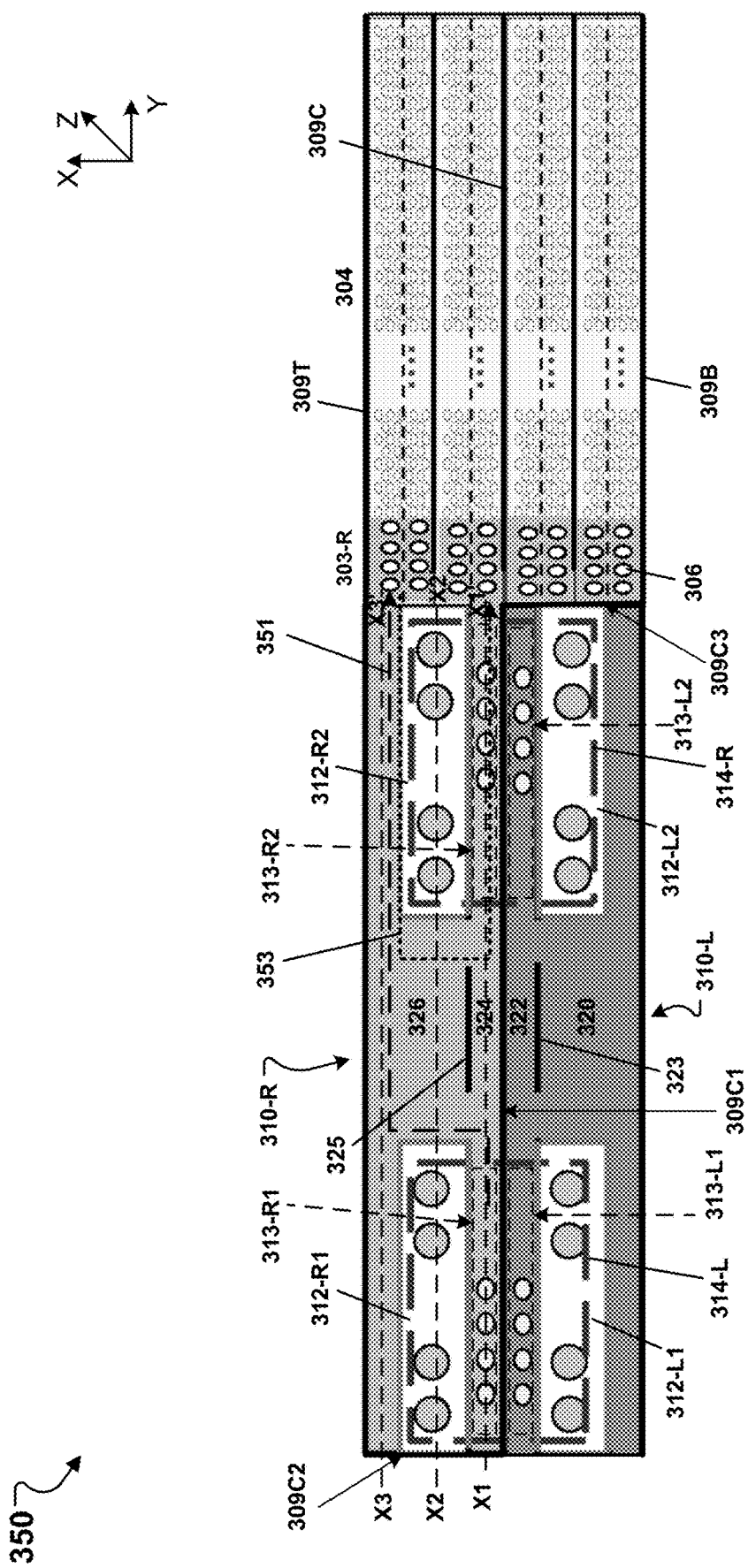
Figures 3E, 3F, 3G:
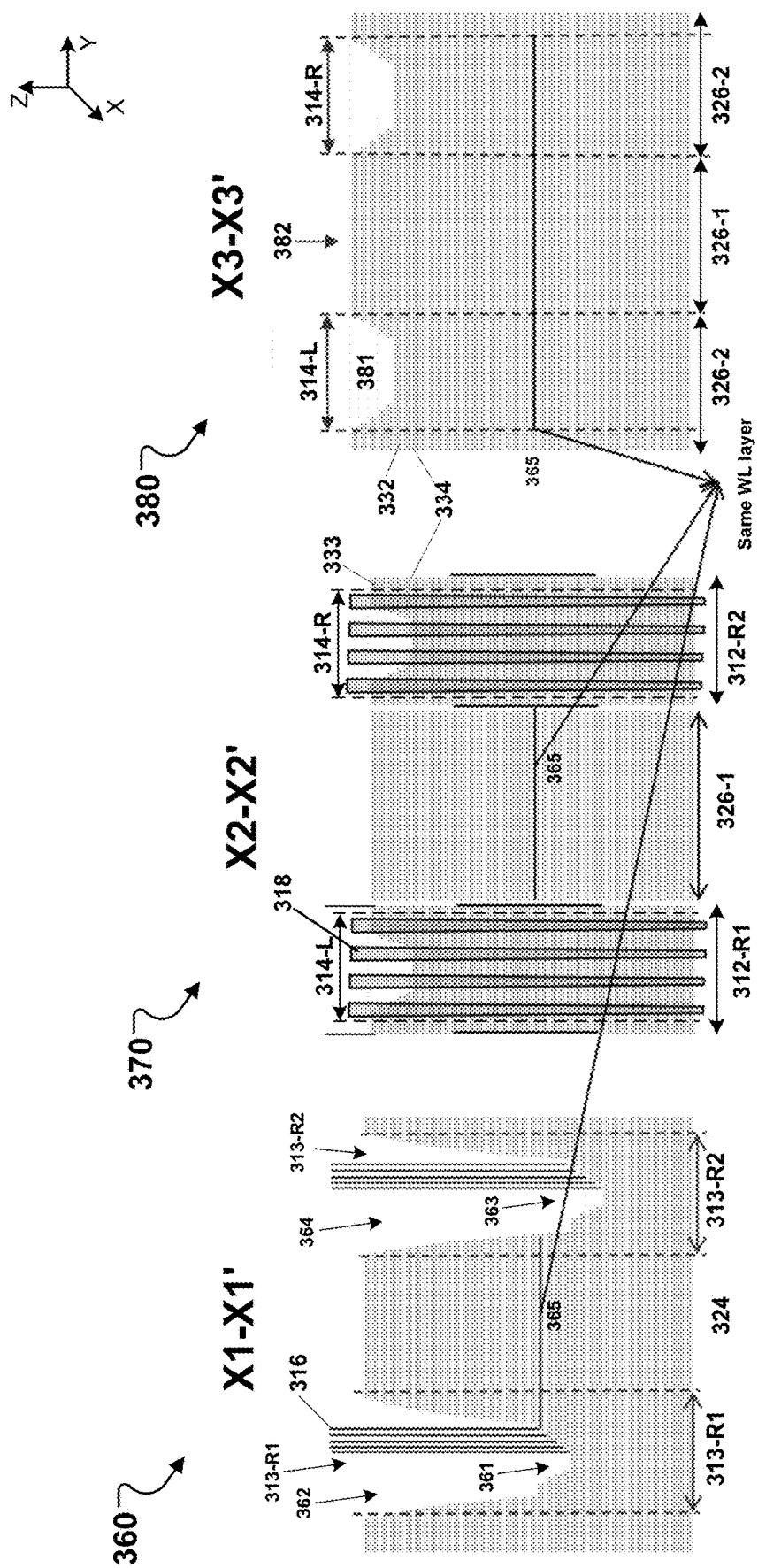

As illustrated in FIG. 3G, the second unprocessed structure 326 in the second part 310-R can include a first area 326-1 and a second area 326-2. As illustrated in FIG. 3F, the first area 326-1 is between the second connection area 312-R1 and the fourth connection area 312-R2 in the second part 310-R along Y direction, and between a conductive slit 325 and the top conductive slit 309T along X direction. The conductive slit 325 is similar to the conductive slit 323, and has a side surface (or wall) covered with a dielectric material (e.g., oxide) insulated from adjacent layers and an inner part filled with a conductive material (e.g., metal). The second area 326-2 (as illustrated in FIG. 3G) includes a first section and a second section with the first area 326-1 therebetween. The first section of the second area 326-2 is between the second connection area 312-R1 and the top conductive slit 309T. The second section of the second area 326-2 is between the fourth connection area 312-R2 and the top conductive slit 309T. The second unprocessed structure 326 is also outside of the process windows 314 and has no stepped or staircase structured word line layers, as illustrated in FIGS. 3B-3C.

The fourth unprocessed structure 324 in the second part 310-R can be between the first word line landing pad area 313-R1 and the second word line landing pad area 313-R2 in the second part 310-R along Y direction, and between the conductive slit 325 and the conductive slit 309C1 along X direction. The second unprocessed structure 326 and the fourth unprocessed structure 324 are conductively connected to the right array structure 304 through the word line layer contacts WL_COA 316 in the word line landing pad areas 313-R1 and 313-R2. As illustrated in FIG. 3A, the fourth unprocessed structure 324 is separated from the second unprocessed structure 326 by the conductive slit 325, which is along Y direction. The conductive slit 325 does not extend to connect the connection areas 312-R1 and 312-R2. Hence, the word line layers in the fourth unprocessed structure 324 can be conductively connected to word line layers in the second unprocessed structure 326 through an unseparated area without the conductive slit 325.

In the formation processes of the conductive slits 323 and 325. A strip slit for forming the conductive slit 323 or 325 extends along Z direction to penetrate the alternating pairs of first insulating layer 333 and second insulating layer 334. The second insulating layers 334 can be removed by etching through the strip slit during the gate replacement process for the central staircase region 310 and replaced with a conductive material (e.g., tungsten) to form conductive layers 332. In some implementations, at least word line layers of conductive layers 332 (e.g., tungsten) in the fourth unprocessed structure 324 and the second unprocessed structure 326 are an integrated piece without separation by the strip slit. Then, the strip slit is covered by a dielectric material (e.g., oxide) on the sidewall surface. A conductive material (e.g., tungsten) is filled within the dielectric material to form the conductive slit 323 or 325. The conductive slit 323 or 325 includes a conductive fence extending along the Y-Z plane and penetrating through the stack of alternating pairs of conductive layer 332 (e.g., tungsten) and second insulating layer 334 (e.g., oxide) as shown in FIG. 3C. Likewise, at least word line layers of conductive layers 332 (e.g., tungsten) in the first unprocessed structure 320 and the third unprocessed structure 322 can be an integrated piece without separation by the strip slit or the conductive slit 323.

FIG. 3B shows the cross-sectional view 330 along Y1-Y1' line across the process window 314-L. A length of the process window 314-L along the X direction is larger than a sum of a length of the first word line landing pad area 313-L1 in the first part 310-L and a length of the first word line landing pad area 313-R1 in the second part 310-R but smaller than a distance from a boundary of the first connection area 312-L1 to a boundary of the second connection area 312-R1. In at least one example along the X direction, a sum of a length of the third unprocessed structure 322 and a length of the fourth unprocessed structure 324 is substantially equal to the sum of the length of the first word line landing pad area 313-L1 and the length of the first word line landing pad area 313-R1. In some examples, the length of the process window 314-L along the X direction is no less than 1.5 times (e.g., about 166%) larger than the sum of the length of the first word line landing pad area 313-L1 and the length of the first word line landing pad area 313-R1. In a particular example, the length of the process window 314-L is ⅝ of a length of the block 300 along the X direction. The sum of the length of the first word line landing pad area 313-L1 and the length of the first word line landing pad area 313-R1 is ⅖ of the length of the block 300. The length of the block 300 can be a distance between the conductive slits 309B and 309T along the X direction. Thus, the word line layer contacts WL_COA 316 are formed within the process window 314-L, and the TACs 318 formed in the first and second connection areas 312-L1 and 312-R1 can be also formed within the process window 314-L.

Additionally, as illustrated in FIG. 3A, along the Y direction, a length of the process window 314-L or 314-R can be smaller than a length of the connection area 312-L1 or 312-R1, or the connection area 312-L2 or 312-R2. In some examples, as illustrated in FIG. 4A, along the Y direction, a length of a process window can be larger than a length of a connection area.

FIG. 3C shows the cross-sectional view 340 along Y2-Y2' line across the unprocessed structures 320, 322, 324 and 326 without crossing the process windows 314. It is shown that outside of the process windows 314, the unprocessed structures 320, 322, 324 and 326 have no stepped word line layers. Additionally, along the Z direction, n-th first conductive layers in the third unprocessed structure 322, the first unprocessed structure 320, and the left array structure 302, and n-th second conductive layers in the fourth unprocessed structure 324, the second unprocessed structure 326, and the right array structure 304, can be in the same layer, where n is an integer.

To further describe the memory block 300, cross-sectional views in the YZ plane are illustrated. For example, FIG. 3D shows a top view 350 (in the XY plane) of the memory block 300, and FIGS. 3E-3G show cross-sectional views X1-X1' 360, X2-X2' 370, and X3-Y3' 380 (in the YZ plane), respectively. The X1-X1' cut line crosses the word line array contacts WL_COAs 316 in the word line landing pad areas 313-R1 and 313-R2. Also, the X1-X1' cut line crosses the fourth unprocessed structure 324. The X2-X2' cut line crosses the through array contacts TACs 318 in the connection areas 312-R1 and 312-R2. Also, the X2-X2' cut line crosses the second unprocessed structure 326. The X3-X3' cut line crosses the first area 326-1 and the second area 326-2 of the second unprocessed structure 326.

The central staircase region 310 can include one or more process windows that can depend on a number of word line layers in the memory block 300. For example, the memory block 300 includes 100 word line layers along the Z direction, and a process window, e.g., MiLC process window 314, can be configured to expose 5 word line layers. The central staircase region 310 can include 20 process windows for driving connection contacts of the 100 word line layers.

As illustrated in FIG. 3E, X1-X1' cut line crosses the word line landing pad areas 313-R1 and 313-R2 in the second part 310-R. Also, the X1-X1' cut line crosses the fourth unprocessed structure 324. The first word line landing pad area 313-R1 in the second part 310-R and the first word line landing pad area 313-L1 in the first part 310-L are in the same process window 314-L. A width (in Y direction) of the word line landing pad area (313-R1 or 313-L1) in the same process window 314-L can have a same width of the process window 314-L. Likewise, the second word line landing pad area 313-R2 in the second part 310-R and the second word line landing pad area 313-L2 in the first part 310-L are in the same process window 314-R. As illustrated in FIG. 3D, a width (in Y direction) of the word line landing pad area (313-R2 or 313-L2) in the same process window 314-R can have a same width of the process window 314-R. The word line landing pad areas 313-R1 and 313-R2 are in respective process windows 314-L and 314-R. The process windows (314-L and 314-R) are obtained by performing a method of staircase structures with landing pads formation for word line layers, for example, the MiLC process. Back to FIG. 3E, the word line landing pad areas 313-R1 and 313-R2 have respective process openings 362, 364 that can have different depth staircases (along the Z direction) to expose target word line layers (e.g., 5 word line layers) that are further etched to form respective stepped structures 361, 363. Each word line layer contact 316 is formed to be conductively connected to a respective stepped word line layer in the word line landing pad areas 313-R1 and 313-R2. Similar to the WL_COA 224 of FIG. 2, the word line layer contacts 316 are electrically coupled to corresponding TACs 318 formed in the connection areas 312-R1, 312-R2, as illustrated in FIG. 3F. As illustrated in FIG. 3E, from the left to the right along the Y direction, the process openings 362, 364 can be deeper and deeper, and the stepped word line layers can be formed from top to bottom along the Z direction.

Each word line layer in the right array structure 304 is electrically connected to a respective contact pad 308 in the circuit. In some implementations, as illustrated in FIG. 3D, at least one of the word line layers in the right array structure 304 extends to a corresponding conductive layer 365 in the second unprocessed structure 326 (shown in FIGS. 3G and 3F) and the fourth unprocessed structure 324 to the same stepped conductive layer 365 (shown in FIG. 3E) in the first word line landing pad area 313-R1 of the second part 310-R. As illustrated in FIG. 3E, a corresponding word line layer contact WL_COA 316 connects the same stepped conductive layer 365, and electrically connects to a corresponding through array contact TAC 318 in the second connection area 312-R1 in FIG. 3F. The corresponding through array contact TAC 318 is connected to a respective contact pad 308 in the circuit. Thus, a signal, current or voltage can be transmitted through a trace 351, as illustrated in FIG. 3D, between the circuit and the word line layer in the right array structure 304.

In some implementations, as illustrated in FIG. 3D, at least one of the word line layers in the right array structure 304 extends to a corresponding conductive layer in the second unprocessed structure 326 and the fourth unprocessed structure 324 to the same stepped conductive layer in the second word line landing pad area 313-R2. A corresponding word line layer contact WL_COA 316 connects the same stepped conductive layer, and electrically connects to a corresponding through array contact TAC 318 in fourth connection area 312-R2. The corresponding through array contact TAC 318 connects respective contact pad 308 in the circuit. Thus, a signal, current or voltage can be transmitted through a trace 353 between the circuit and the word line layer in the right array structure 304.

The word line layers in the right array structure 304 can be electrically connected to the circuit along the trace 351 (as shown in FIG. 3D) or the trace 353. In some implementations, at least one of the word line layers in the right array structure 304 is electrically connected to the circuit via a corresponding stepped conductive layer in the second word line landing pad area 313-R2, a corresponding word line layer contact 316, and a corresponding through array contact TAC 318, without through the second unprocessed structure 326 and/or the fourth unprocessed structure 324.

In some implementations, the corresponding conductive layer 365 is in the second area 326-2 and the first area 326-1 of the second unprocessed structure 326 as shown in FIG. 3G along the X3-X3' cut line. The conductive layer 365 in the first area 326-1 of the second unprocessed structure 326 is between the second connection area 312-R1 and the fourth connection area 312-R2 along the Y direction (as shown in FIG. 3F along the X2-X2' cut line). The conductive layer 365 further extends from the first area 326-1 of the second unprocessed structure 326 into the fourth unprocessed structure 324, the word line landing pad area 313-R1 or 313-R2 (as shown in FIG. 3F along the X1-X' cut line). The conductive layer 365 is integral in the first area 326-1 of the second unprocessed structure 326 and the fourth unprocessed structure 324 through the unseparated area without the conductive slit 325 as shown in FIG. 3D. The conductive layer 365, which can be a single conductive layer (as illustrated in FIGS. 3E-3G), extends from the right array structure 304 to the second unprocessed structure 326, the fourth unprocessed structure 324, and the word line landing pad area 313-R1 or 313-R2 in a same word line level.

FIG. 4A illustrate another example 400 of process windows 420, 430 for a central staircase region 410 in a 3D memory device. The central staircase region 410 is positioned between two adjacent array structures of memory cells, e.g., the left array structure 302 and the right array structure 304 of FIG. 3A.

The central staircase region 410 includes a first part for the left array structure (e.g., the left array structure 302 of FIG. 3A) and a second part for the right array structure (e.g., the right array structure 304 of FIG. 3A). Along the X direction, the first part includes a left unprocessed structure 402, two connection areas 404, 434, and a left staircase structure 406, and the second part includes a right staircase structure 416, two connection areas 414, 444, and a right unprocessed structure 412.

A process window can have a different size and/or a different shape. Compared to the process window 314-L or 314-R of FIGS. 3A-3B, a process window 420, 430 for the central staircase region 410 has a length along the Y direction that is larger than a length of the connection area 404, 414, 434 or 444. The process window 420, 430 can also have a rectangular shape. The process window 420, 430 can have a length along the X direction that is larger than a sum of a length of the left staircase structure 406 and a length of the right staircase structure 416 but is smaller than a sum of the lengths of the left and right staircase structures 406, 416 and the lengths of the connection areas 404 and 414.

FIG. 4B illustrates another example 450 of process windows 460, 470 for the central staircase region 410. Different from the process windows 420, 430 of FIG. 4A, the process windows 460, 470 can be a square shape. Along the Y direction, the process window 460, 470 has a length smaller than a length of the connection areas 404, 414, 434, 444. Along the X direction, the process window 460, 470 can have a length that is larger than a sum of a length of the left staircase structure 406 and a length of the right staircase structure 416 but is smaller than a sum of the lengths of the left and right staircase structures 406, 416 and the lengths of the connection areas 404 and 414.

Figure 5:
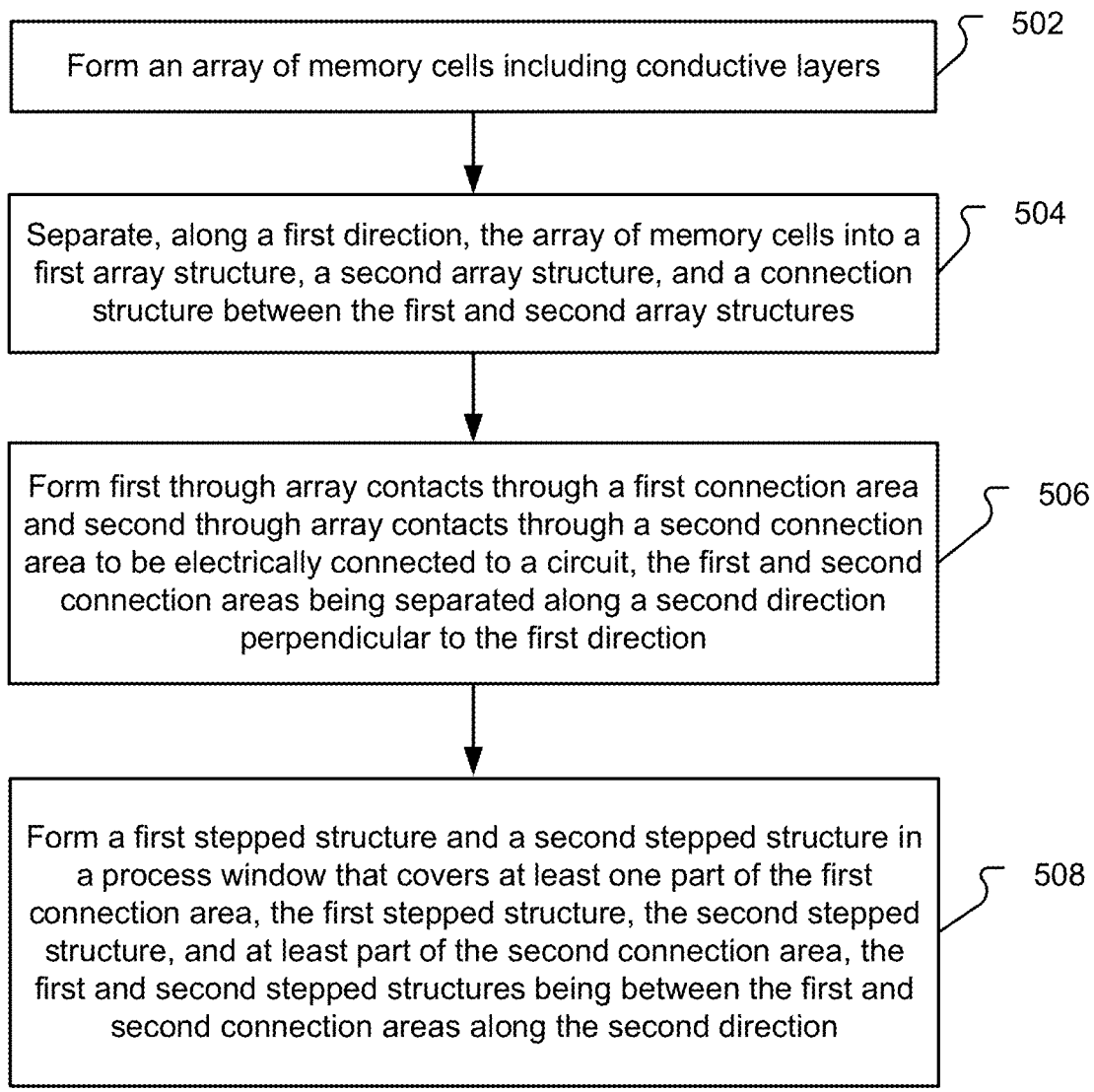
FIG. 5 illustrates a flow chart of an example of a process for forming a driving connection structure of a 3D memory device.

FIG. 5 illustrates a flow chart of an example of a process 500 for forming a driving connection structure of a 3D memory device. The 3D memory device can be implemented as the memory 116 of FIG. 1A.

At 502, an array of memory cells including conductive layers is formed. The memory cells can be the memory cells 301 of FIG. 3A. The array of memory cells can be formed by forming alternating conductive layers (e.g., made of metal) and insulating layers (e.g., OX) and then by forming vertical channels (VCs) through the alternating conductive layers and insulating layers.

At 504, along a first direction (e.g., Y direction), the array of memory cells is separated into a first array structure (e.g., the left array structure 302 of FIG. 3A), a second array structure (e.g., the right array structure 304 of FIG. 3A), and a connection structure (e.g., the central staircase region 310 of FIG. 3A) between the first array structure and the second array structure.

At 506, first through array contacts (e.g., the TAC 318 of FIG. 3A) through a first connection area (e.g., the first connection area 312-L1 of FIG. 3A) and second through array contacts through a second connection area (e.g., the second connection area 312-R1 of FIG. 3A) are formed to be electrically connected to a circuit (e.g., the CuA layer 202 of FIG. 2). The first and second connection areas are separated along a second direction (e.g., X direction) perpendicular to the first direction.

At 508, a first stepped structure and a second stepped structure are formed in a process window (e.g., the process window 314-L of FIG. 3A). The first stepped structure and the second stepped structure are adjacent to each other along the second direction. The process window covers at least one part of the first connection area, the first stepped structure, the second stepped structure, and at least part of the second connection area. The first stepped structure and the second stepped structure are between the first connection area and the second connection area along the second direction.

The process 500 can further include: forming first layer contacts (e.g., the word line layer contact WL_COA 316 of FIG. 3A) coupled to the first conductive layers in the first stepped structure along a third direction (e.g., Z direction) perpendicular to a plane defined by the first direction and the second direction, and forming second layer contacts (e.g., the WL_COA 316 of FIG. 3A) coupled to the second conductive layers in the second stepped structure along the third direction. The process 500 can further include: forming corresponding conductive interconnections (e.g., the interconnections 223 of FIG. 2) to connect the first layer contacts and the second layer contacts to the first through array contacts and the second through array contacts.

In some examples, along the first direction, a length of the process window can be smaller than at least one of a length of the first connection area or a length of the second connection area. In some examples, the length of the process window is larger than at least one of the length of the first connection area or the length of the second connection area along the first direction. The length of the first connection area can be identical to the length of the second connection area. The first layer contacts and the second layer contacts can be formed in the process window. The first through array contacts and the second through array contacts can be at least partially formed in the process window or outside of the process window.

In some implementations, the connection structure further includes: a third connection area (e.g., the third connection area 312-L2 of FIG. 3A) spaced from the first connection area along the first direction, and a fourth connection area (e.g., the fourth connection area 312-R2 of FIG. 3A) spaced from the second connection area along the first direction. A second process window (e.g., the process window 314-R of FIG. 3A) can cover, along the second direction, at least one part of the third connection area, the first stepped structure, the second stepped structure, and at least one part of the fourth connection area.

The connection structure can include: a first unprocessed structure (e.g., 320 of FIG. 3A) electrically coupled to the first conductive layers in the first array structure and a second unprocessed structure (e.g., 326 of FIG. 3A) electrically coupled to the second conductive layers in the second array structure.

The first connection area can be arranged between the first stepped structure and the first unprocessed structure along a second direction perpendicular to the first direction, and the second connection area can be arranged between the second stepped structure and the second unprocessed structure along the second direction. The first stepped structure and the second stepped structure can be adjacent to each other and arranged between the first connection area and the second connection area along the second direction.

At least one part of the first unprocessed structure can be, along the first direction, between the first connection area and the third connection area and outside of the first process window and the second process window. At least one part of the second unprocessed structure (e.g., 326-1 of FIG. 3F)

can be, along the first direction, between the second connection area and the fourth connection area and outside of the first process window and the second process window. Another part of the first unprocessed structure can be separated from the first stepped structure by the first connection area or the third connection area along the second direction. Another part of the second unprocessed structure (e.g., 326-2 of FIG. 3G) is separated from the second stepped structure by the second connection area or the fourth connection area along the second direction.

In some implementations, at least one of the first conductive layers in the first array structure is electrically connected to the circuit via a corresponding first unprocessed conductive layer (e.g., 365 of FIG. 3F and FIG. 3G) in the first unprocessed structure, a corresponding first stepped conductive layer (e.g., 365 of FIG. 3E) in the first stepped structure, a corresponding one of the first layer contacts, and a corresponding one of the first through array contacts. The corresponding first unprocessed conductive layer in the first unprocessed structure and the corresponding first stepped conductive layer in the first stepped structure form a single conductive layer, as illustrated in FIGS. 3E-3G. The corresponding first unprocessed conductive layer in the first unprocessed structure can include a first sub-layer (e.g., 365 of FIG. 3F) in a first part (e.g., 326-1 of FIG. 3F) of the first unprocessed structure that is between the first connection area and the second connection area along the first direction and a second sub-layer (e.g., 365 of FIG. 3E) in a second part (e.g., 326-2 of FIG. 3G) of the first unprocessed structure that is separated from the first stepped structure by the first connection area and the third connection area along the second direction. The first sub-layer and the second sub-layer can form the corresponding first unprocessed conductive layer.

In some implementations, the corresponding first stepped conductive layer in the first stepped structure and the corresponding one of the first layer contacts are in one of the first process window or the second process window.

In some implementations, at least one of the first conductive layers in the first array structure is electrically connected to the circuit via a corresponding first stepped conductive layer in the first stepped structure, a corresponding one of the first layer contacts, and a corresponding one of the first through array contacts, without through the first unprocessed structure.

The first conductive layers can be orderly arranged in the first array structure along the third direction (e.g., Z direction) perpendicular to a plane defined by the first direction and the second direction, and the second conductive layers are orderly arranged in the second array structure along the third direction. An n-th first conductive layer in the first array structure and an n-th second conductive layer in the second array structure can be electrically connected to a same conductive pad (e.g., 308 of FIG. 3B) in the circuit, n being an integer.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A semiconductor device comprising:
   a first array structure of memory cells comprising first conductive layers;
   a second array structure of memory cells comprising second conductive layers;
   a connection structure arranged between the first array structure and the second array structure along a first direction; and
   a circuit arranged adjacent to the connection structure, wherein the connection structure comprises:
   a first connection area through which the first conductive layers are electrically connected to the circuit,
   a first stepped structure configured to individually expose the first conductive layers,
   a second stepped structure configured to individually expose the second conductive layers, and
   a second connection area through which the second conductive layers are connected to the circuit,
   wherein the first stepped structure and the second stepped structure are arranged between the first connection area and the second connection area along a second direction perpendicular to the first direction,
   wherein the first conductive layers of the first array structure are stacked along a third direction perpendicular to the first direction and the second direction, and the second conductive layers of the second array structure are stacked along the third direction,
   wherein the first array structure, the first connection area, and the first stepped structure are separated from the second array structure, the second connection area, and the second stepped structure by a conductive slit structure, and
   wherein the conductive slit structure comprises:
   a first slit portion between the first stepped structure and the second stepped structure along the second direction, the first slit portion extending along the first direction and the third direction,
   a second slit portion between the first array structure and the second connection area along the first direction, the second slit portion extending along the second direction and the third direction, and
   a third slit portion between the first connection area and the second array structure along the first direction, the third slit portion extending along the second direction and the third direction.

2. The semiconductor device of claim 1,
   wherein the first conductive layers are configured to be electrically connected to the circuit via first layer contacts coupled to the first conductive layers in the first stepped structure and first through array contacts through the first connection area and coupled to the circuit, the first through array contacts extending along the third direction, and wherein the second conductive layers are configured to be electrically connected to the circuit via second layer contacts coupled to the second conductive layers in the second stepped structure and second through array contacts through the second connection area and coupled to the circuit, the second through array contacts extending along the third direction.

3. The semiconductor device of claim 2, wherein each of the first layer contacts and the second layer contacts is electrically connected to a respective one of the first through array contacts and the second through array contacts via a corresponding electrical interconnection.

4. The semiconductor device of claim 2, wherein a process window covers, along the second direction, at least one part of the first connection area, the first stepped structure, the second stepped structure, and at least one part of the second connection area.

5. The semiconductor device of claim 4, wherein, along the first direction, a length of the process window is smaller than at least one of a length of the first connection area or a length of the second connection area.

6. The semiconductor device of claim 2, wherein the connection structure further comprises:
a third connection area spaced from the first connection area along the first direction; and
a fourth connection area spaced from the second connection area along the first direction,
wherein a first process window covers, along the second direction, at least one part of the first connection area, the first stepped structure, the second stepped structure, and at least one part of the second connection area, and
wherein a second process window covers, along the second direction, at least one part of the third connection area, the first stepped structure, the second stepped structure, and at least one part of the fourth connection area.

7. The semiconductor device of claim 6, wherein the connection structure further comprises:
a first unprocessed structure electrically coupled to the first conductive layers in the first array structure, wherein at least one part of the first unprocessed structure is positioned, along the first direction, between the first connection area and the third connection area and outside of the first process window and the second process window, and
a second unprocessed structure electrically coupled to the second conductive layers in the second array structure, wherein at least one part of the second unprocessed structure is positioned, along the first direction, between the second connection area and the fourth connection area and outside of the first process window and the second process window.

8. The semiconductor device of claim 7, wherein another part of the first unprocessed structure is separated from the first stepped structure by the first connection area or the third connection area along the second direction, and
wherein another part of the second unprocessed structure is separated from the second stepped structure by the second connection area or the fourth connection area along the second direction.

9. The semiconductor device of claim 7, wherein at least one of the first conductive layers in the first array structure is electrically connected to the circuit via a corresponding first unprocessed conductive layer in the first unprocessed structure, a corresponding first stepped conductive layer in the first stepped structure, a corresponding one of the first layer contacts, and a corresponding one of the first through array contacts.

10. The semiconductor device of claim 9, wherein the corresponding first unprocessed conductive layer in the first unprocessed structure and the corresponding first stepped conductive layer in the first stepped structure form a single conductive layer.

11. The semiconductor device of claim 9, wherein the corresponding first unprocessed conductive layer in the first unprocessed structure comprises:
a first sub-layer in a first part of the first unprocessed structure that is between the first connection area and the third connection area along the first direction and
a second sub-layer in a second part of the first unprocessed structure that is separated from the first stepped structure by the first connection area or the third connection area along the second direction,
wherein the first sub-layer and the second sub-layer form the corresponding first unprocessed conductive layer.

12. The semiconductor device of claim 9, wherein the corresponding first stepped conductive layer in the first stepped structure and the corresponding one of the first layer contacts are in one of the first process window or the second process window.

13. The semiconductor device of claim 7, wherein at least one of the first conductive layers in the first array structure is electrically connected to the circuit via a corresponding first stepped conductive layer in the first stepped structure, a corresponding one of the first layer contacts, and a corresponding one of the first through array contacts, without an electrical connection passing through the first unprocessed structure.

14. The semiconductor device of claim 2, wherein the first conductive layers are orderly arranged in the first array structure along a third direction perpendicular to a plane defined by the first direction and the second direction, and the second conductive layers are orderly arranged in the second array structure along the third direction,
wherein an n-th first conductive layer in the first array structure and an n-th second conductive layer in the second array structure are electrically connected to a same conductive pad in the circuit, n being an integer.

15. A semiconductor device comprising:
a first array structure of memory cells comprising first conductive layers;
a second array structure of memory cells comprising second conductive layers;
a connection structure arranged between the first array structure and the second array structure along a first direction; and
a circuit arranged adjacent to the connection structure,
wherein the connection structure comprises:
a first stepped structure configured to individually expose the first conductive layers,
a first unprocessed structure electrically coupled to the first conductive layers in the first array structure,
a first connection area through which the first conductive layers are electrically connected to the circuit, the first connection area being arranged between the first stepped structure and the first unprocessed structure along a second direction perpendicular to the first direction,
a second stepped structure configured to individually expose the second conductive layers, a second unprocessed structure electrically coupled to the second conductive layers in the second array structure, and a second connection area through which the second conductive layers are electrically connected to the circuit, the second connection area being arranged between the second stepped structure and the second unprocessed structure along the second direction, wherein the first conductive layers of the first array structure are stacked along a third direction perpendicular to the first direction and the second direction, and the second conductive layers of the second array structure are stacked along the third direction, wherein the first array structure, the first connection area, the first stepped structure, and the first unprocessed structure are separated from the second array structure, the second connection area, the second stepped structure, and the second unprocessed structure by a conductive slit structure, and wherein the conductive slit structure comprises:
a first slit portion between the first stepped structure and the second stepped structure along the second direction, the first slit portion extending along the first direction and the third direction,
a second slit portion between the first array structure and the second connection area along the first direction, the second slit portion extending along the second direction and the third direction, and
a third slit portion between the first connection area and the second array structure along the first direction, the third slit portion extending along the second direction and the third direction.

16. The semiconductor device of claim 15, wherein the first conductive layers are configured to be electrically connected to the circuit via first layer contacts coupled to the first conductive layers in the first stepped structure and first through array contacts through the first connection area and coupled to the circuit, the first through array contacts extending along the third direction,
wherein at least one of the first conductive layers in the first array structure is electrically connected to the circuit via a corresponding first unprocessed conductive layer in the first unprocessed structure, a corresponding first stepped conductive layer in the first stepped structure, a corresponding one of the first layer contacts, and a corresponding one of the first through array contacts, wherein the second conductive layers are configured to be electrically connected to the circuit via second layer contacts coupled to the second conductive layers in the second stepped structure and second through array contacts through the second connection area and coupled to the circuit, the second through array contacts extending along the third direction, and wherein at least one of the second conductive layers in the second array structure is electrically connected to the circuit via a corresponding second unprocessed conductive layer in the second unprocessed structure, a corresponding second stepped conductive layer in the second stepped structure, a corresponding one of the second layer contacts, and a corresponding one of the second through array contacts.

17. The semiconductor device of claim 15, wherein the connection structure further comprises:
a third connection area spaced from the first connection area along the first direction; and
a fourth connection area spaced from the second connection area along the first direction,
wherein a first process window covers, along the second direction, at least one part of the first connection area, the first stepped structure, the second stepped structure, and at least one part of the second connection area, and
wherein a second process window covers, along the second direction, at least one part of the third connection area, the first stepped structure, the second stepped structure, and at least one part of the fourth connection area.

18. The semiconductor device of claim 17,
wherein the first unprocessed structure comprises:
a first part between the first connection area and the third connection area along the first direction and outside of the first process window and the second process window, and
a second part separated from the first stepped structure by the first connection area and the third connection area along the second direction, and
wherein the second unprocessed structure comprises:
a third part between the second connection area and the fourth connection area along the first direction and outside of the first process window and the second process window, and
a fourth part separated from the second stepped structure by the second connection area and the fourth connection area along the second direction.

* * * * *